United States Patent [19]
Seok et al.

[11] Patent Number: 5,274,595
[45] Date of Patent: Dec. 28, 1993

[54] DATA TRANSMISSION CIRCUIT WITH SEGMENTED INPUT/OUTPUT LINES

[75] Inventors: Yong-Sik Seok, Taegu; Dong-Su Jeon, Seoul, both of Rep. of Korea

[73] Assignee: SamSung Electronics Co. Ltd., Suwon, Rep. of Korea

[21] Appl. No.: 777,133

[22] Filed: Oct. 16, 1991

[30] Foreign Application Priority Data

Jul. 23, 1991 [KR] Rep. of Korea ............... 91-12632

[51] Int. Cl.$^5$ .................. G11C 7/00; G11C 11/409
[52] U.S. Cl. .......................... 365/203; 365/202; 365/189.01; 365/189.09; 365/196
[58] Field of Search ............... 365/203, 202, 189.01, 365/189.09, 196

[56] References Cited

U.S. PATENT DOCUMENTS

| | | | |
|---|---|---|---|
| 4,418,399 | 11/1983 | Sakurai | 365/182 |
| 4,855,957 | 8/1989 | Nogami | 365/189.04 |
| 4,916,667 | 9/1990 | Miyabayshi et al. | 365/203 |
| 5,111,434 | 5/1992 | Cho | 365/203 |

FOREIGN PATENT DOCUMENTS 2-53288 2/1990 Japan.
2-249195 10/1990 Japan.

*Primary Examiner*—Eugene R. LaRoche
*Assistant Examiner*—Viet Q. Nguyen
*Attorney, Agent, or Firm*—Robert E. Bushnell

[57] ABSTRACT

Disclosed is a data transmission circuit with a higher data access time and allowing for higher chip density, used for a semiconductor memory device. A preamplifier connects segmented I/O lines with data I/O lines, amplifies weak voltage from the bit lines and is mounted on the strapping area of the chip so as to secure the high chip density.

24 Claims, 6 Drawing Sheets

DATA TRANSMISSION CIRCUIT WITH SEGMENTED INPUT/OUTPUT LINES

BACKGROUND OF THE INVENTION

This invention relates to a dynamic random access memory (DRAM) of semiconductor device and particularly to a data transmission circuit with a high data access time.

A general tendency in semiconductor device field is toward higher density of the semiconductor device as well as higher operational speed thereof. However, if the semiconductor device meets the demand for the higher density, its operational speed is lowered; contrastingly if the semiconductor device is made so as to increase the operation speed, the density of the semiconductor device is lowered. Therefore, in order to meet both demands for the higher density and higher operation speed of the semiconductor device, the structure of the data transmission circuit and the elements used therefor must be carefully considered and selected.

Referring to FIGS. 1 and 2, typical conventional data transmission circuits are described, wherein the circuit of FIG. 1 shows a compact structure having common input/output lines 5, 6 through which the data are transmitted. The data transmission circuit of FIG. 1 is a detailed view of a specific part of the semiconductor memory cell array. In structure, the conventional data transmission circuit is comprised of bit lines 1 and 2 coupled to a memory cell (not shown), the common input/output lines 5 and 6, input/output transistors 3 and 4 for connecting the bit lines with the common input/output lines, and a sense amplifier 7 operating in response to control signals $\phi_S$, $\phi_{SD}$. The input/output transistors 3 and 4 operate in response to a column selection line (CSL) signal. The sense amplifier 7 is a generally known type and thus, a concrete view thereof is not described.

As can be understood from FIG. 1, such compact scheme is favorable to a higher density of the semiconductor device. However, the common input/output line's loading is relatively much smaller than the bit line's loading, so that the weak signals from the bit lines 1, 2 can be hardly delivered into the common input/output lines. Therefore, the sense amplifier 7 is used for amplifying the weak signals and the time taken for amplifying the signals is called the sensing time. The real sensing time of this conventional circuit is about 5-10 ns which quite long and the sensing time is greatly affects the data access time. Accordingly, if the sensing time is longer, the data access time is longer, too. In conclusion, the circuit of FIG. 1 is favorable to a higher density of the semiconductor device, however the fast data access time cannot be realized.

In FIG. 2, another conventional data transmission circuit for solving the above problem is proposed. This circuit employs the direct sensing method disclosed in pages 1102-1109, *IEEE Journal of Solid-State Circuits*, Vol. 25, No. 5, October 1990. In structure, the input/output transistors 3, 4 and common input/output lines 5, 6 of FIG. 1 are respectively replaced by write transistors 13, 14 and data input/output lines 15, 16. The write transistors 13, 14 receive; at the gates thereof, a write column selection line (WCSL) signal. Furthermore, data read lines 17, 18 which are additionally provided are indirectly coupled to the bit lines 1, 2 via transmitting transistors 21, 22 and sensing transistors 19, 20, so that the bit line voltages are not directly coupled to the data read lines 17, 18. The sensing transistors 19, 20 and transmitting transistors 21, 22 are operating as a pre-amplifier. For more information, reference should be made to the above mentioned paper.

In the circuit of FIG. 2, since the bit line signals are pre-amplified by the sensing transistors 19, 20 and transmitting transistors 21, 22 before applied to the data read lines 17 and 18, even the weak signals from the bit lines 1, 2 can be successfully delivered into the data read lines 17 and 18. Therefore, the sensing time is not required and thus, the data access time can be reduced. However, this circuit has additional elements for realizing the fast access time, resulting in the low chip density.

SUMMARY OF THE INVENTION

It is accordingly an object of the present invention to provide a data transmission circuit with a high data access time as well as a high chip density.

According to the present invention, a data transmission circuit for controlling data transmission in a semiconductor memory device having memory cells for storing data, bit lines for transmitting the data, a sense amplifier for amplifying potential at the bit lines, and data I/O lines, includes: a pair of segmented I/O lines connected to the bit lines; and a pre-amplifier connected between the segmented I/O lines and the data I/O lines, for amplifying the potentials at the segmented I/O lines and/or the data I/O lines so as to transmit the potentials therebetween.

BRIEF DESCRIPTION OF THE DRAWINGS

For a better understanding of the invention and to show how the same may be carried into effect, reference will now be made, by way of example, to the accompanying diagrammatic drawings, in which.

DETAILED DESCRIPTION OF THE PREFERRED EMBODIMENTS

Figure 1:
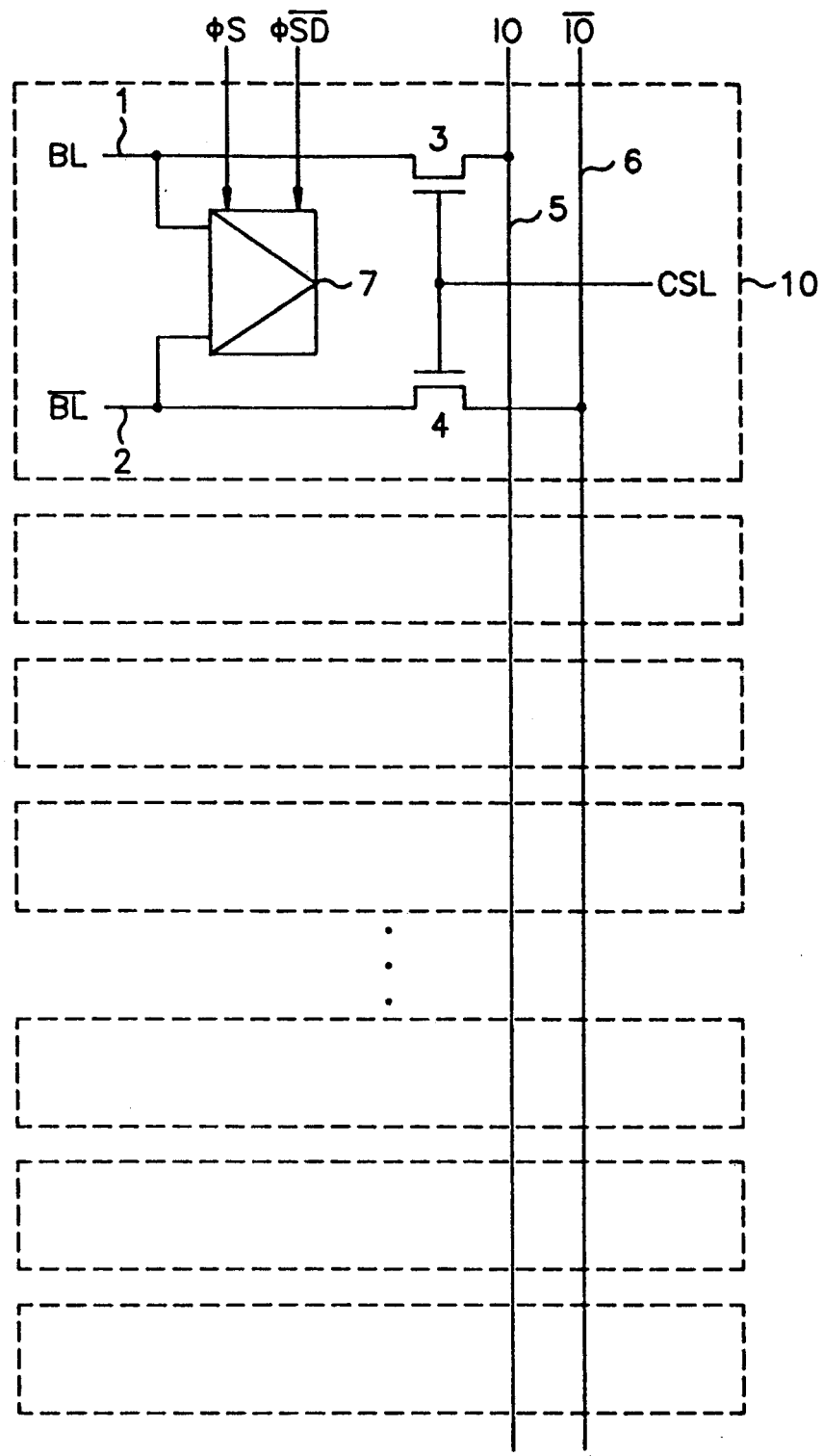
FIG. 1 is an embodiment of a conventional data transmission circuit.
Figure 2:
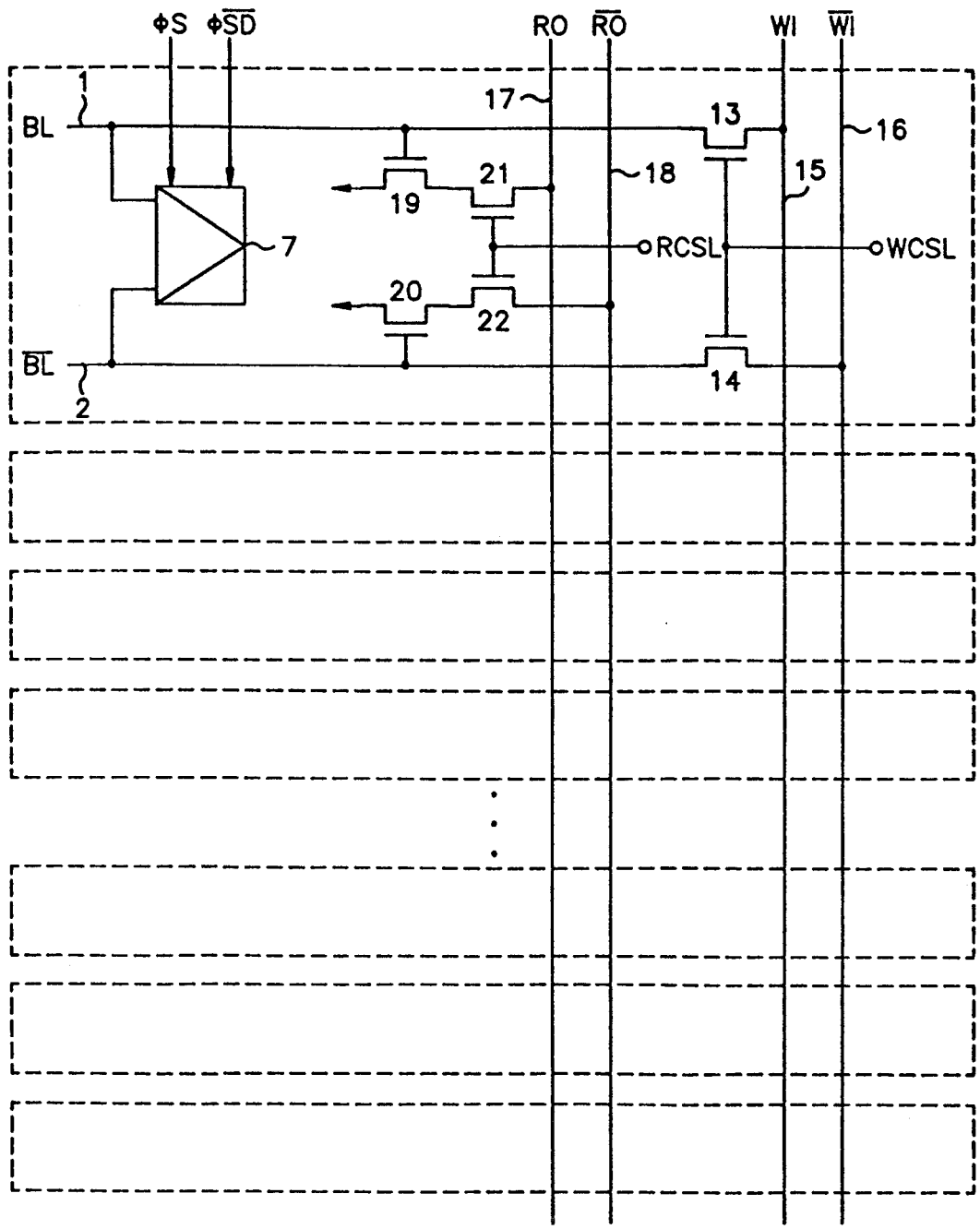
FIG. 2 is another embodiment of the conventional data transmission circuit.
Figure 3:
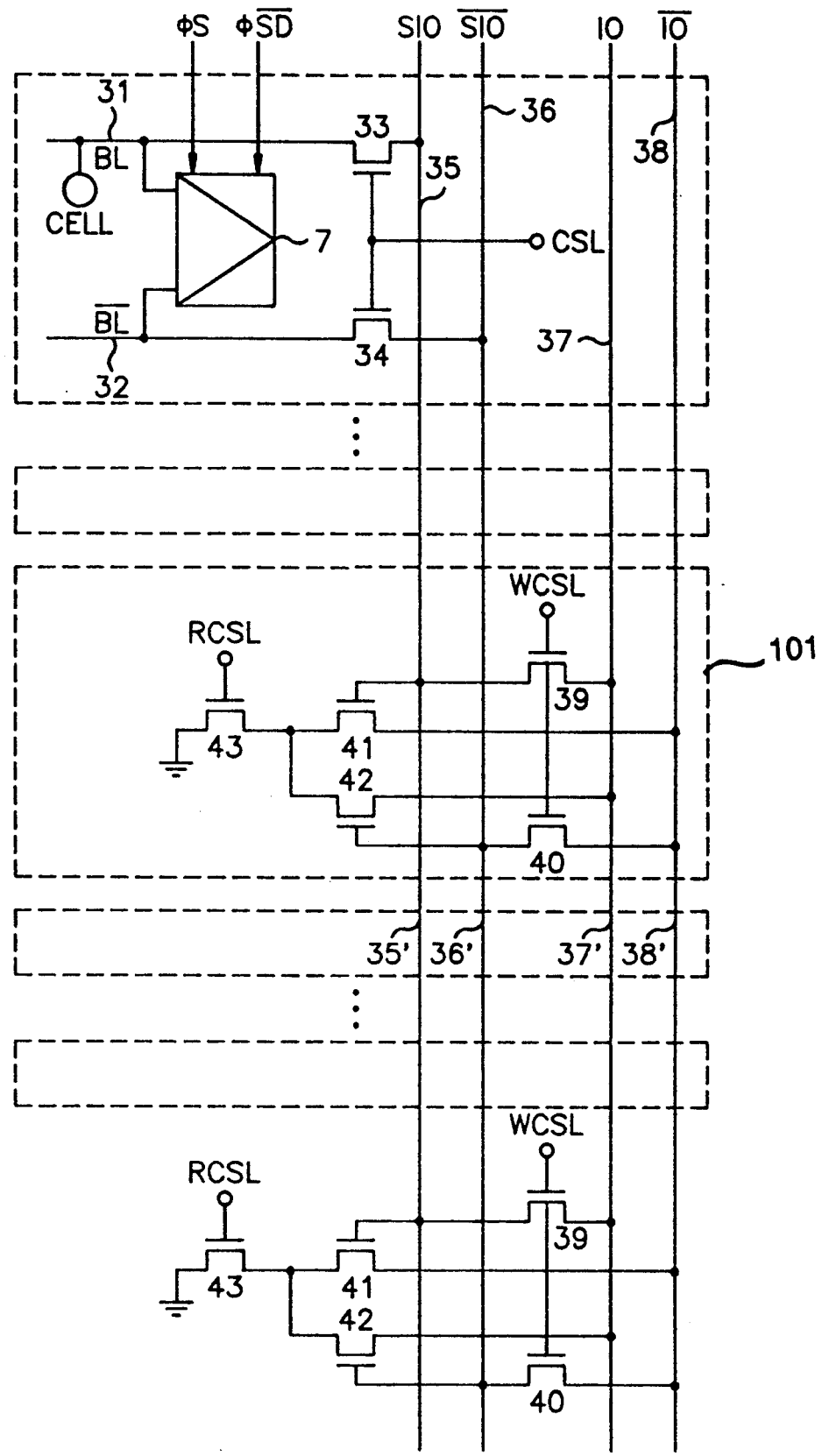
FIG. 3 is an embodiment of a data transmission circuit in accordance with the present invention.

Referring to FIG. 3, reference numerals 35, 36 are segmented input/output lines (sometimes called sub-I/O lines or divided I/O lines) and reference numeral 101 is a pre-amplifier according to the present invention. In the drawing, the potentials at bit lines 31, 32 are respectively coupled to the segmented I/O lines 35, 36 and transmitted to data I/O lines 37, 38 through the pre-amplifier 101. It should be noted herein that in order to secure a fast data access time, the charges of data from a memory cell are shared directly up to the segmented I/O lines and transmitted to the I/O lines through the pre-amplifier, so that the time required for the sensing operation is not necessary as in the circuitry of FIG. 2. Moreover, according to the present invention, since the pre-amplifier is positioned at a strapping area, the inventive circuit requires very little extra space for the pre-amplifier, compared with the conventional circuit of FIG. 2.

Figure 4:
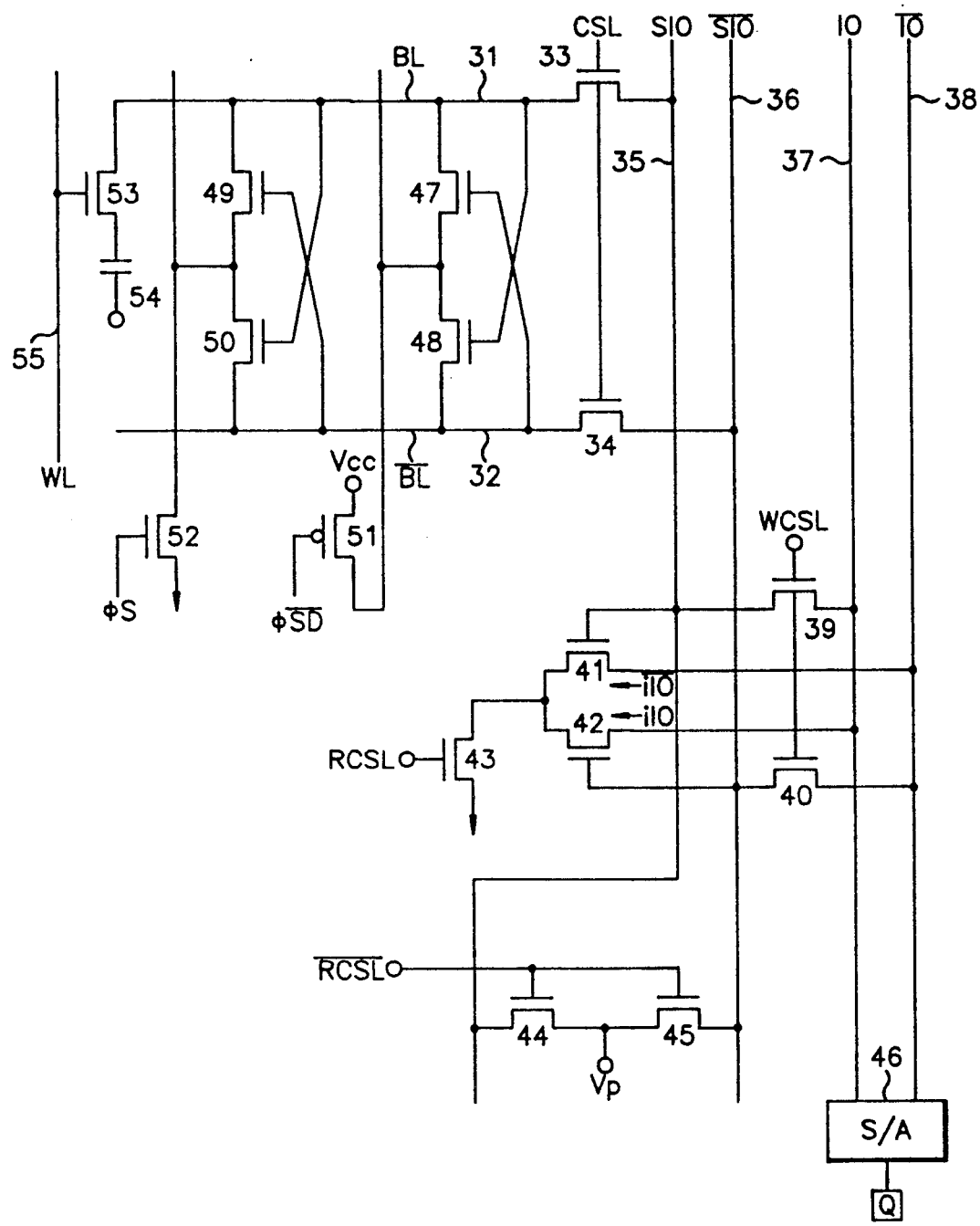
FIG. 4 is a detailed view of the circuit shown in FIG. 3.

With reference to FIG. 4, the pre-amplifier of FIG. 3 will now be described in detail. In the drawing, the memory cell and sense amplifier are the same as the conventional ones and thus will not be explained herein. The pre-amplifier includes a write pre-amplifier and a read pre-amplifier. The write pre-amplifier is comprised of a first write transistor 39 of which channel is connected between the first data I/O line 37 and the first segmented I/O line 35, the gate of which is connected to the WCSL signal, and a second write transistor 40 of which channel is connected between the second data I/O line 38 and the second segmented I/O line 36, the gate of which is connected to the WCSL signal. In the meantime, the read pre-amplifier is comprised of a discharging transistor 43 of which gate is connected to a RCSL (Read Column Selection Line) signal, an end of the channel thereof being coupled to the ground level, a first read transistor 41 of which channel is connected between the other end of the channel of the discharging transistor 43 and the second data I/O line 38, the gate thereof being connected to the first segmented I/O line 35, and a second read transistor 42 of which channel is connected between the other end of the channel of the discharging transistor 43 and the first data I/O line 37, the gate thereof being connected to the second segmented I/O line 36. As can be appreciated in FIG. 4, two MOS transistors 44, 45 which are controlled by the $\overline{\text{RCSL}}$ signal are disposed between the segmented I/O lines 35, 36. This is to prevent the floating state of the non-selected segmented I/O lines 35', 36' shown in FIG. 3. Further, a voltage Vp of Vcc/2 is applied to the common terminal of the two MOS transistors 44, 45. However, level of the voltage Vp can be changed according to the characteristics of the memory elements.

Figure 5:
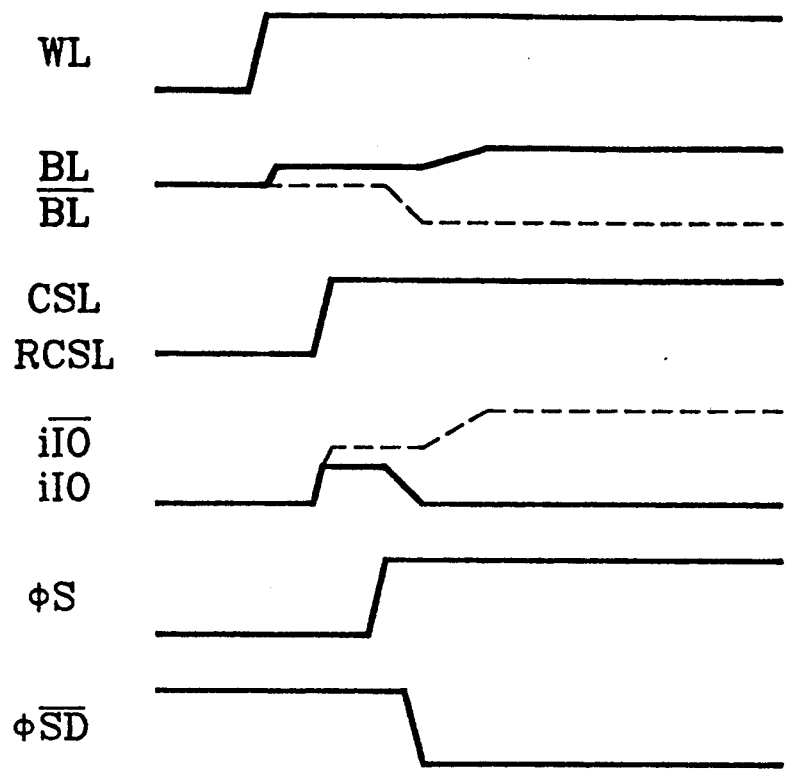
FIG. 5 is a timing diagram of the circuit shown in FIG. 4.
Figure 6:
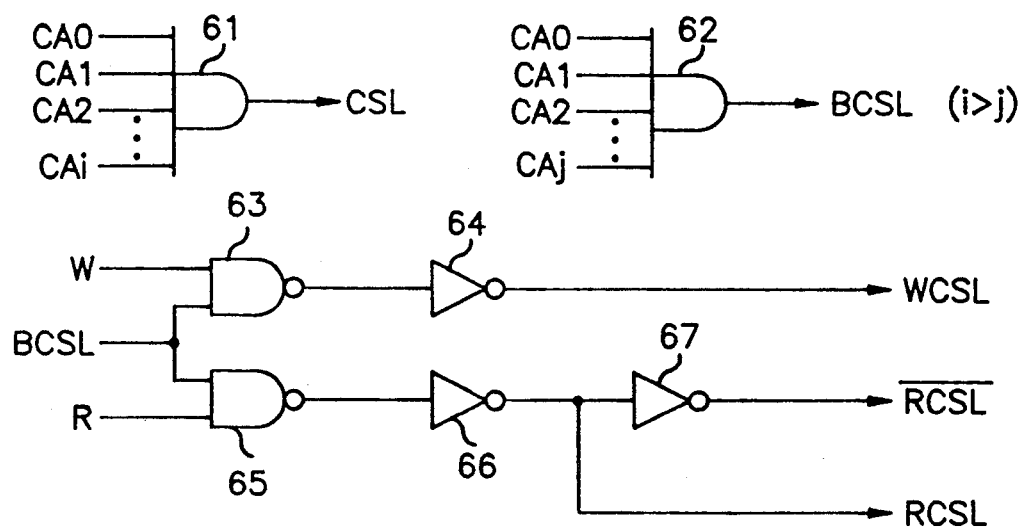
FIG. 6 is a logic circuit diagram generating the clock pulses of FIG. 5.

Reading operation of the data transmission circuit of FIG. 4 will now be described with reference to FIGS. 5 and 6. The operations that a word line is selected and then, the data from a selected memory cell is delivered into the segmented I/O line 35 are well known to a person in the art and thus, will be omitted from the explanation. It is noted from FIGS. 5 and 6 that if the CSL signal is enabled, then the RCSL signal increases to the logic "high" state. Then, the logic "high" state of the first segmented I/O line 35 will turn on the first read transistor 41, thereby discharging the voltage of the second data line 38 to the ground terminal through the transistors 41, 43. As a result, the current $i_{10}$ passing through the first read transistor 41 increases as shown in FIG. 5. Contrarily, the logic "low" state of the second segmented I/O line 36 turns off the second read transistor 42, thereby isolating potential of the first data I/O line 37 from the ground terminal. Therefore, the current $i_{10}$ passing through the second read transistor 42 flows at the beginning for a little while and then does not flow thereafter. As a result, the potential differences between the first and second data I/O lines 37, 38 will increase and the differentiated potential will be generated out through the sense amplifier 46. The data access time according to the above operation is 5-10 ns faster than that of the prior art device and this can meet the demand for the high speed operation. However, the data writing operation is reversal to the data reading operation except that it is performed through the write transistors 39, 40 and thus will not be explained further.

Figure 7:
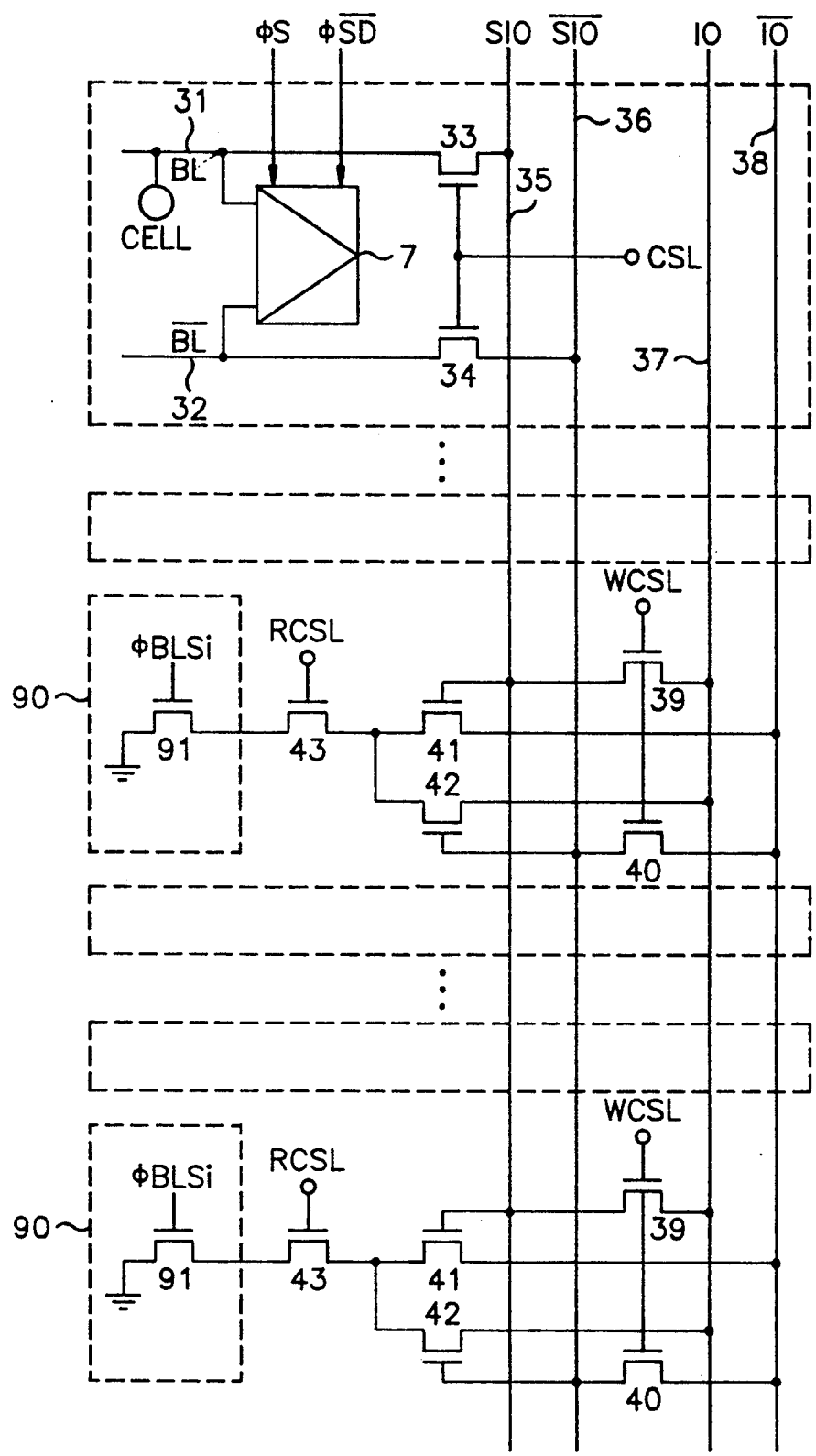
FIG. 7 is another embodiment of the data transmission circuit in accordance with the present invention.

When the data transmission circuit according to the present invention is applied to a semiconductor memory device in which memory cell array is divided into blocks, in row and column directions, there is particularly needed a specific means for enabling a selected block additionally to the circuit of FIG. 4, and such device is described in FIG. 7. With use of the enabling means, when a number of blocks in a column are accessed, it is prevented that the data I/O lines of all the blocks in the same column are at a time connected to the ground terminal to discharge. Accordingly, the enabling means 90 to which a block selection signal is applied should be additionally included. In this embodiment, the enabling means is comprised of a MOS transistor 91 of which channel is connected between the ground voltage terminal and the channel of a discharging transistor 43, the gate thereof being controlled by the block selection signal. However, it can be readily understood to a person in the art that the enabling means can be readily modified without departing from the invention.

As described heretofore, the invention circuit does not need the bit line sensing operation so that the data access time may decrease. Furthermore, the pre-amplifier for connecting the segmented I/O lines with the data I/O lines can be arranged in the strapping area according to the present invention, thereby securing the high chip density.

Although specific constructions of the invention have been illustrated and described herein, it is not intended that the invention be limited to the elements and constructions disclosed. One skilled in the art will easily recognize that the particular elements or subconstructions may be used without departing from the scope and spirit of the invention. Furthermore, in a pseudo static RAM in which the address is not multiplexed, the invention is particularly effective.

What is claimed is:

1. A data transmission circuit for controlling data transmission in a semiconductor memory device having memory cells for storing data, bit lines for transmitting said data, a sense amplifier for amplifying potentials at said bit lines, and data input/output lines, said circuit comprising:

a pair of segmented input/output lines connected to said bit lines; and a pre-amplifier connected between said segmented input/output lines and said data input/output lines, for amplifying and transmitting potentials between said segmented input/output lines and said data input/output lines, wherein said pre-amplifier comprises:

a write pre-amplifier including:

a first write transistor having channel coupled between a first line of said data input/output lines and a first line of said segmented input/output lines, and a second write transistor having channel coupled between a second line of said data input/output lines and a second line of said segmented input/output lines;

a discharging transistor having a first end of a channel coupled to a ground terminal, and having gate coupled to a read column selection line; and a read pre-amplifier including:

a first read transistor having channel coupled between said second line of said data input/output lines and a second end of said channel of said discharging transistor, and having a gate coupled to said first line of said segmented input/output lines, and a second read transistor having a channel coupled between said first line of said data input/output lines and said second end of said channel of said discharging transistor, and having a gate coupled to said second line of said segmented input/output lines.

2. A data transmission circuit as claimed in claim 4, wherein said pre-amplifier is mounted on a strapping area.

3. A data transmission as claimed in claim 4, further comprised of transmission transistors for connecting said segmented input/output lines with said bit lines, in response to a column selection signal.

4. A data transmission circuit as claimed in claim 1, wherein said first and second write transistors, said first and second read transistors, and said discharging transistor are N-type metal oxide semiconductor transistors.

5. A data transmission circuit for controlling data transmission in a semiconductor memory device comprising a memory cell array, divided into blocks, for storing data, bit lines for transmitting said data, a sense amplifier for amplifying potentials at said bit lines, and data input/output lines, said circuit comprising:

a pair of segmented input/output connected to said bit lines;

a pre-amplifier, connected between said segmented input/output lines and said data input/output lines, for amplifying and providing potentials between said segmented input/output lines and said data input/output lines;

means for selecting a block having a selected memory cell; and means, responsive to a control signal and coupled between said segmented input/output lines, for providing a bias voltage to said segmented input/output lines to prevent said segmented input/output lines from electrically floating.

6. A data transmission circuit as claimed in claim 5, wherein said bias-voltage providing means comprises:

first and second metal oxide semiconductor transistors coupled to each other between each of said segmented input/output lines and having a common terminal being provided with said bias voltage, said first and second metal oxide semiconductor transistors being controlled by a read column selection signal.

7. A data transmission circuit for controlling data transmission in a semiconductor memory device comprising a memory cell array, divided into blocks, for storing data, bit lines for transmitting said data, a sense amplifier for amplifying potentials at said bit lines, and data input/output lines, said circuit comprising:

a pair of segmented input/output lines connected to said bit lines;

means for selecting a block having a selected memory cell;

a pre-amplifier, connected between said segmented input/output lines and said data input/output lines, for amplifying and providing potentials between said segmented input/output lines and said data input/output lines, wherein said pre-amplifier comprises:

a write pre-amplifier responsive to a first control signal and including:

a first write transistor having a channel coupled between a first line of said data input/output lines and a first line of said segmented input/output lines, and a second write transistor having a channel coupled between a second line of said data input/output lines and a second line of said segmented input/output lines;

a discharging transistor having a first end of a channel coupled for receiving a reference voltage, and having a gate coupled to a read column selection line;

a read pre-amplifier responsive to a second control signal and including:

a first read transistor having a channel coupled between said second line of said data input/output lines and a second end of said channel of said discharging transistor, and having a gate coupled to said first line of said segmented input/output lines, and a second read transistor having a channel coupled between said first line of said data input/output lines and said second end of said channel of said discharging transistor, and having gate coupled to said second line of said segmented input/output lines.

8. A data transmission circuit as claimed in claim 7, wherein said first and second control signals are a write column selection line signal and a read column selection line signal, respectively.

9. A data transmission circuit as claimed in claim 7, wherein said selecting means comprises a metal oxide semiconductor transistor responsive to a control signal having channel connected between a reference voltage terminal and said discharging transistor.

10. A data transmission circuit as claimed in claim 9, wherein said control signal is a block selection signal.

11. A data transmission circuit for controlling data transmission in a semiconductor memory device, said circuit comprising:

a pair of segmented input/output lines connected to a pair of bit lines; and a pre-amplifier, connected between said segmented input/output lines and a pair of data input/output lines, for amplifying and providing potentials at said generated input/output lines and said data input/output lines so as to transmit said potentials therebetween, wherein said pre-amplifier comprises:

a write pre-amplifier including:

a first write transistor having a channel coupled between a first line of said data input/output lines and a first line of said segmented input/output lines, and a second write transistor having a channel coupled between a second line of said data input/output lines and a second line of said segmented input/output lines;

a discharging transistor having a first end of a channel coupled to a ground terminal, and having gate coupled to a read column selection line; and a read pre-amplifier including:

a first read transistor having a channel coupled between said second line of said data input/output lines and a second end of said channel of said discharging transistor, and having a gate coupled to said first line of said segmented input/output lines, and a second read transistor having a channel coupled between said first line of said data input/output lines and said second end of said channel of said discharging transistor, and having a gate coupled to said second line of said segmented input/output lines.

12. A data transmission circuit as claimed in claim 11, wherein said pre-amplifier is mounted on a stapping area.

13. A data transmission circuit as claimed in claim 11, further comprised of a transmission transistor for connecting said segmented input/output lines with said bit lines in response to a column selection signal.

14. A data transmission circuit as claimed in claim 11, wherein said first and second write transistors, said first and second read transistors, and said discharging transistor are N-type metal oxide semiconductor transistors.

15. A data transmission circuit in a semiconductor memory device including memory cells for storing data, a plurality of complimentary pairs of bit lines for transmitting said data to and from said memory cells, a data input/output line, and a data complimentary input/output line, said data transmission circuit comprising:
  a segmented input/output line and a segmented complimentary input/output line each coupled to corresponding ones of said complimentary pairs of said bit lines;
  a first read transistor including a first end of a first read transistor channel coupled to said data complimentary input/output line, a second end of said first read transistor channel for receiving a reference potential, and a first read transistor gate coupled to said segmented input/output line, and
  a second read transistor including a first end of a second read transistor channel coupled to said data input/output line, a second end of said second read transistor channel for receiving said reference potential, and a second read transistor gate coupled to said segmented complementary input/output line.

16. A data transmission circuit as claimed in claim 15, further comprising:
  a first write transistor including a first write transistor channel coupled between said data input/output line and said segmented input/output line and a first write transistor gate for receiving a write control signal; and
  a second write transistor including a second write transistor channel coupled between said data complimentary input/output line and said segmented complimentary input/output line and a second write transistor gate for receiving said write control signal.

17. A data transmission circuit as claimed in claim 15, further comprising a discharging transistor including a discharging transistor channel coupled between a reference potential terminal providing said reference potential and said second end of said first read transistor channel and said second end of said second read transistor channel, and a discharging transistor gate for receiving a read column selection signal.

18. A data transmission circuit as claimed in claim 16, further comprising a discharging transistor including a discharging transistor channel coupled between a reference potential terminal providing said reference potential and said second end of said first read transistor channel and said second end of said second read transistor channel, and a discharging transistor gate for receiving a read column selection signal.

19. A data transmission circuit in a semiconductor memory device including memory cells for storing data, a plurality of complimentary pairs of bit lines for transmitting said data to and from said memory cells, a data input/output line, and a data complimentary input/output line, said data transmission circuit comprising:
  a segmented input/output line and a segmented complimentary input/output line each coupled to corresponding ones of said complimentary pairs of said bit lines; and
  means for amplifying and transferring potentials between said data input/output line and said segmented input/output line and between said data complimentary input/output line and said segmented complimentary input/output line; and
  means for providing a bias voltage in response to a control signal to prevent said segmented input/output line and said segmented complimentary input/output line from electrically floating.

20. A data transmission circuit as claimed in claim 19, wherein said bias voltage providing means comprises:
  a first bias transistor including a first bias transistor channel connected between a bias voltage terminal for providing said bias voltage and said segmented input/output line; and
  a second bias transistor including a second bias transistor channel connected between said bias voltage terminal and said segmented complimentary input/output line.

21. A data transmission circuit as claimed in claim 19, wherein said amplifying and transferring means comprises:
  a first read transistor including a first end of a first read transistor channel coupled to said data complimentary input/output line, a second end of said first read transistor channel for receiving a reference potential, and a first read transistor gate coupled to said segmented input/output line, and
  a second read transistor including a first end of a second read transistor channel coupled to said data input/output line, a second end of said second read transistor channel for receiving said reference potential, and a second read transistor gate coupled to said segmented complementary input/output line.

22. A data transmission circuit as claimed in claim 21, wherein said amplifying and transferring means further comprises:
  a first write transistor including a first write transistor channel coupled between said data input/output line and said segmented input/output line and a first write transistor gate for receiving a write control signal; and
  a second write transistor including a second write transistor channel coupled between said data complimentary input/output line and said segmented complimentary input/output line and a second write transistor gate for receiving said write control signal.

23. A data transmission circuit as claimed in claim 21, further comprising a discharging transistor including a discharging transistor channel coupled between a reference potential terminal providing said reference potential and said second end of said first read transistor channel and said second end of said second read transistor channel, and a discharging transistor gate for receiving a read column selection signal.

24. A data transmission circuit as claimed in claim 23, wherein said control signal is a compliment of said read column selection signal.

* * * * *

UNITED STATES PATENT AND TRADEMARK OFFICE
CERTIFICATE OF CORRECTION

PATENT NO. :        5,274,595
DATED       :        December 28, 1993
INVENTOR(S) :       Yong-Sik Seok; Dong-Su Jeon It is certified that error appears in the above-indentified patent and that said Letters Patent is hereby corrected as shown below:

Column 1,    Line 12,    Change "speed" to --speeds-- ;

Line 37,    After "type", Insert --,-- ;

Line 49,    After "time", Delete "is" ;

Line 63,    After "receive", Delete ";", Insert --,--.

Signed and Sealed this

Twentieth Day of September, 1994

Attest:

BRUCE LEHMAN

*Attesting Officer*        *Commissioner of Patents and Trademarks*